United States Patent
Sweeney et al.

(10) Patent No.: US 12,369,285 B2
(45) Date of Patent: Jul. 22, 2025

(54) LIQUID IMMERSION COOLING TANK WITH VARIABLE FLOW FOR HIGH DENSITY COMPUTER SERVER EQUIPMENT

(71) Applicant: Tyco Fire & Security GmbH, Neuhausen am Rheinfall (CH)

(72) Inventors: Michael J Sweeney, Seattle, WA (US); David Patrick Selmser, St Albert (CA); John Bernard Zwicker, Edmonton (CA); Shahreen Beente Haider, Edmonton (CA)

(73) Assignee: TYCO FIRE & SECURITY GMBH, Neuhausen am Rheinfal (CH)

( * ) Notice: Subject to any disclaimer, the term of this patent is extended or adjusted under 35 U.S.C. 154(b) by 0 days.

(21) Appl. No.: 17/967,658

(22) Filed: Oct. 17, 2022

(65) Prior Publication Data

US 2023/0032562 A1   Feb. 2, 2023

Related U.S. Application Data

(62) Division of application No. 17/491,041, filed on Sep. 30, 2021, now Pat. No. 11,696,423.
(Continued)

(51) Int. Cl.
  *H05K 7/20* (2006.01)
(52) U.S. Cl.
  CPC ..... *H05K 7/20836* (2013.01); *H05K 7/20236* (2013.01); *H05K 7/20263* (2013.01); *H05K 7/20272* (2013.01); *H05K 7/20781* (2013.01)
(58) Field of Classification Search
  CPC ............... H05K 7/20836; H05K 7/203; H05K 7/20236; H05K 7/20781; H05K 7/20772; H05K 7/20281; H05K 7/20763; H05K 7/20818; H05K 7/20827; H05K 7/20809; H05K 7/20381; H05K 7/20209; H05K 7/20263; H05K 7/2027
See application file for complete search history.

(56) References Cited

U.S. PATENT DOCUMENTS

| 10,123,463 B2 | 11/2018 | Best et al. |
| 2014/0216688 A1* | 8/2014 | Shelnutt ............. F28D 15/0266 165/104.13 |

(Continued)

FOREIGN PATENT DOCUMENTS

WO   2017091862   6/2017

OTHER PUBLICATIONS

International Search Report and Written Opinion for PCT Application No. PCT/US2022/028153, mailed Sep. 6, 2022, 14 pages.

*Primary Examiner* — Adam B Dravininkas
(74) *Attorney, Agent, or Firm* — Fletcher Yoder, PC

(57) ABSTRACT

An immersion cooling system includes an electronic component, a thermally conductive dielectric liquid, and a tank defining a tank interior configured to receive the electronic component and the thermally conductive dielectric liquid for cooling the electronic component. The immersion cooling system also includes a wall positioned external to the tank to coordinate with the tank to define an overflow gap extending between the tank and the wall. The overflow gap is configured to receive an overflow of the thermally conductive dielectric liquid from the tank interior.

20 Claims, 7 Drawing Sheets

Related U.S. Application Data

(60) Provisional application No. 63/185,321, filed on May 6, 2021.

(56) References Cited

U.S. PATENT DOCUMENTS

| | | |
|---|---|---|
| 2014/0216711 A1 | 8/2014 | Shelnutt et al. |
| 2014/0307384 A1* | 10/2014 | Best .................... H05K 7/1497 |
| | | 361/679.53 |
| 2014/0355212 A1 | 12/2014 | Campbell et al. |
| 2014/0362527 A1* | 12/2014 | Best ................... H05K 7/20781 |
| | | 361/679.53 |
| 2015/0181762 A1* | 6/2015 | Boyd ................. H05K 7/20781 |
| | | 165/104.33 |
| 2015/0373882 A1 | 12/2015 | Smith |
| 2016/0143191 A1 | 5/2016 | Smith |
| 2017/0280587 A1 | 9/2017 | Watanabe et al. |
| 2017/0354061 A1 | 12/2017 | Saito |
| 2019/0166726 A1* | 5/2019 | Tung ....................... G01F 25/10 |
| 2019/0317570 A1 | 10/2019 | Salto |
| 2020/0029464 A1 | 1/2020 | Inano et al. |
| 2020/0037467 A1* | 1/2020 | Ishinabe ............ H05K 7/20236 |
| 2020/0288600 A1* | 9/2020 | Gao ................... H05K 7/20272 |
| 2020/0315059 A1* | 10/2020 | Gao ................... H05K 7/20836 |
| 2020/0323108 A1* | 10/2020 | Bilan ........................ F28F 9/22 |
| 2020/0383237 A1 | 12/2020 | Hashimoto |
| 2020/0389997 A1* | 12/2020 | Tung ...................... H05K 7/203 |
| 2021/0378148 A1 | 12/2021 | Chen et al. |
| 2021/0410319 A1 | 12/2021 | Manousakis et al. |
| 2022/0151097 A1 | 5/2022 | McManis et al. |

* cited by examiner

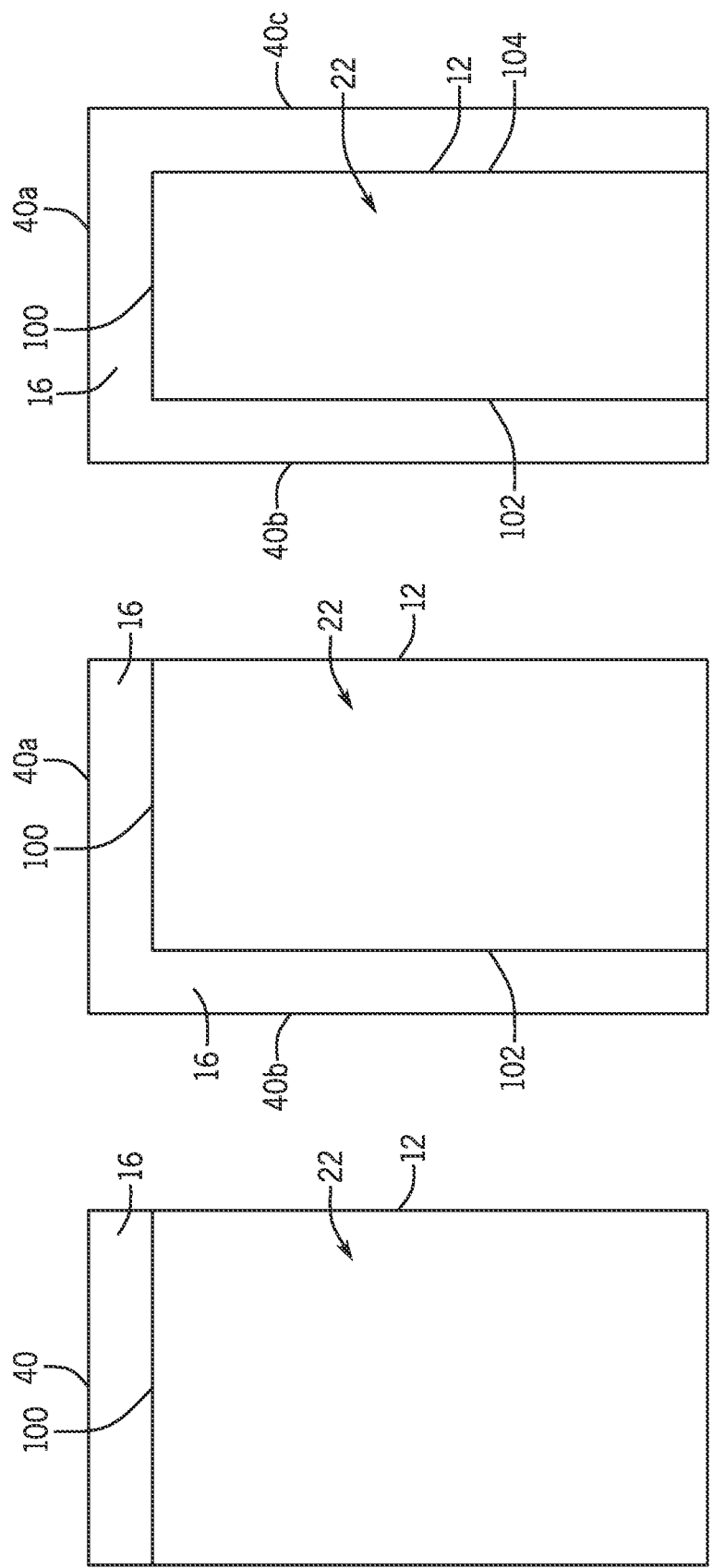

LIQUID IMMERSION COOLING TANK WITH VARIABLE FLOW FOR HIGH DENSITY COMPUTER SERVER EQUIPMENT

CROSS-REFERENCE TO RELATED APPLICATIONS

This application is a divisional of U.S. application Ser. No. 17/491,041, entitled "LIQUID IMMERSION COOLING TANK WITH VARIABLE FLOW FOR HIGH DENSITY COMPUTER SERVER EQUIPMENT," filed Sep. 30, 2021, which claims priority from and the benefit of U.S. Provisional Application Ser. No. 63/185,321, entitled "LIQUID IMMERSION COOLING TANK WITH VARIABLE FLOW FOR HIGH DENSITY COMPUTER SERVER EQUIPMENT," filed May 6, 2021, which are hereby incorporated by reference in their entireties for all purposes.

BACKGROUND OF THE DISCLOSURE

This section is intended to introduce the reader to various aspects of art that may be related to various aspects of the present disclosure, which are described below. This discussion is believed to be helpful in providing the reader with background information to facilitate a better understanding of the various aspects of the present disclosure. Accordingly, it should be understood that these statements are to be read in this light, and not as admissions of prior art.

Demand for data centers to process and store information has dramatically increased. Data centers may include a relatively large number of computer servers having delicate instruments that require certain thermal conditions to operate appropriately. For example, temperature control of the computer servers may enable the computer servers to operate safely and efficiently.

While data centers are often air cooled, immersion cooling systems may be used to cool the computer servers via a liquid coolant in which the computer servers are submerged. For example, conventional immersion cooling systems may employ a tank including liquid coolant therein, where the liquid coolant is utilized to cool the computer servers in the tank. Unfortunately, cooling computer servers through the use of conventional immersion cooling systems may be unpredictable and difficult to control, which may increase power consumption, reduce efficiency, and reduce temperature control of the computer servers. Further, conventional immersion cooling systems may employ an extraneous number of components and complex control schemes, thereby increasing a cost of such conventional immersion cooling systems. For the foregoing reasons, among others, it is now recognized that improved immersion cooling systems and methods are desired.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

In an embodiment, an immersion cooling system includes an electronic component, a thermally conductive dielectric liquid, and a tank defining a tank interior configured to receive the electronic component and the thermally conductive dielectric liquid for cooling the electronic component. The immersion cooling system also includes a wall positioned external to the tank to coordinate with the tank to define an overflow gap extending between the tank and the wall. The overflow gap is configured to receive an overflow of the thermally conductive dielectric liquid from the tank interior.

In another embodiment, an immersion cooling system includes a tank defining a tank interior configured to receive an electronic component and a thermally conductive dielectric liquid for cooling the electronic component. The immersion cooling system also includes a perforated plate of the tank. Perforations of the perforated plate are configured to receive a flow of the thermally conductive dielectric liquid and distribute the thermally conductive dielectric liquid to the tank interior.

In another embodiment, a method of cooling an electronic component via an immersion cooling system includes distributing a thermally conductive dielectric liquid to a tank interior of a tank via openings in a plate disposed at a bottom side of the tank. The method also includes cooling the electronic component inside of the tank interior with the thermally conductive dielectric liquid. The method also includes passing an overflow of the thermally conductive dielectric liquid over an edge of an upper side of the tank opposing the bottom side of the tank and into an overflow gap positioned between the tank and a wall disposed external to the tank.

BRIEF DESCRIPTION OF THE DRAWINGS

Various aspects of this disclosure may be better understood upon reading the following detailed description and upon reference to the drawings in which:

FIG. 7 is a top schematic view of a portion of an immersion cooling system where an overflow gap borders only one side of a tank of the immersion cooling system, in accordance with an aspect of the present disclosure;

FIG. 8 is a top schematic view of a portion of an immersion cooling system where an overflow gap borders only two sides of a tank of the immersion cooling system, in accordance with an aspect of the present disclosure;

FIG. 9 is a top schematic view of a portion of an immersion cooling system where an overflow gap borders only three sides of a tank of the immersion cooling system, in accordance with an aspect of the present disclosure;

DETAILED DESCRIPTION

Figure 1:
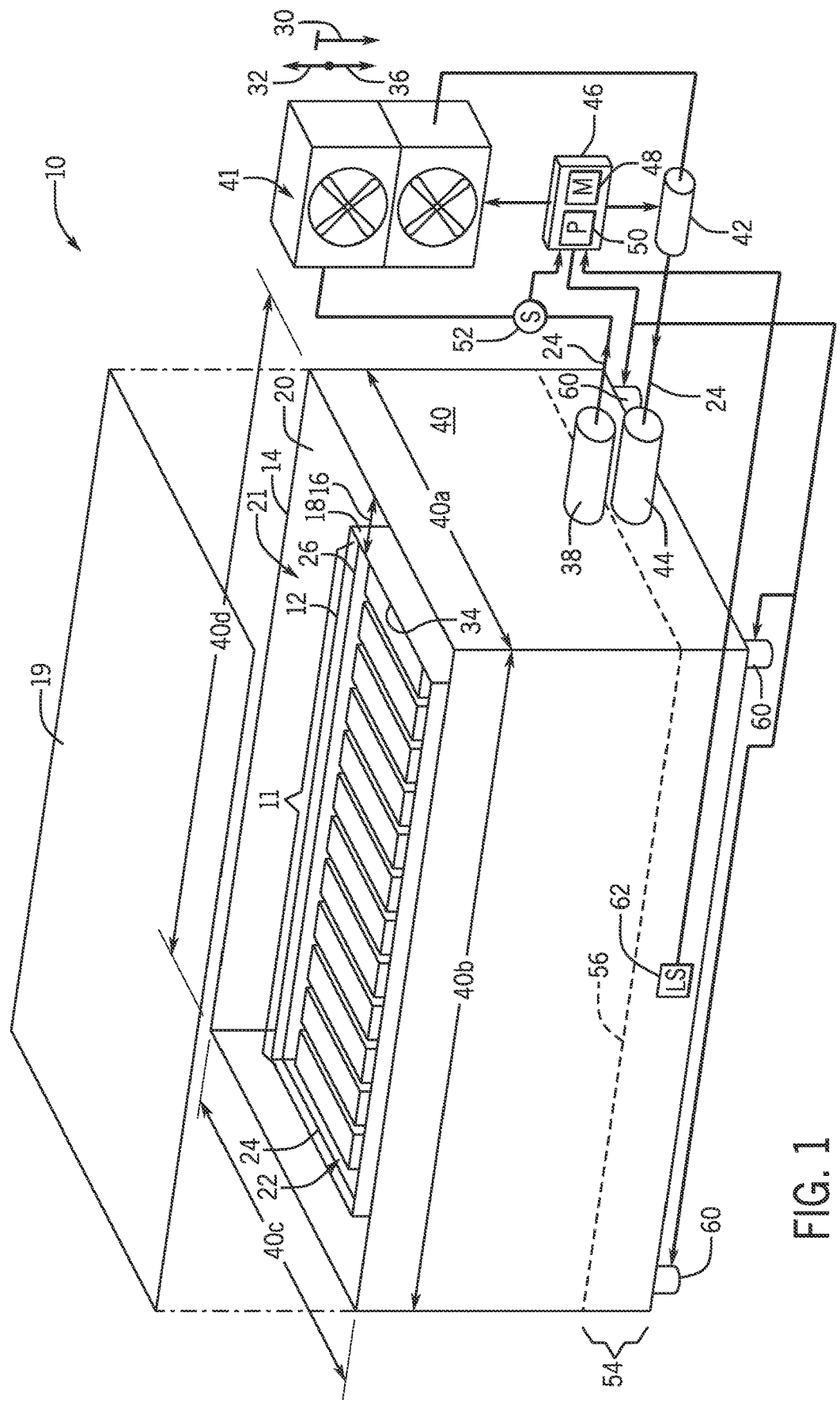
FIG. 1 is a schematic illustration of an immersion cooling system configured to cool electronic components, such as computer servers, in accordance with an aspect of the present disclosure.

One or more specific embodiments of the present disclosure will be described below. These described embodiments are only examples of the presently disclosed techniques. Additionally, in an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features.

The present disclosure relates to immersion cooling systems. More specifically, the present disclosure relates to immersion cooling systems employing a tank configuration (e.g., dual tanks) that may be insulated and with a perforated plate that directs liquid coolant (e.g., a thermally conductive dielectric liquid) for cooling electronic components (e.g., computer servers).

Immersion cooling systems have become increasingly prevalent for cooling applications in data centers. Data centers may include a relatively large number of computer servers having delicate instruments that require certain temperature control to operate appropriately. In accordance with the present disclosure, an immersion cooling system includes a first tank (e.g., inner tank) defining a tank interior configured to receive electronic components, such as computer servers, and a liquid coolant (e.g., thermally conductive dielectric liquid) to cool the electronic components. The first tank (e.g., inner tank) may include a plate, such as a perforated plate, at a bottom of the first tank. The plate may be configured to distribute the liquid coolant into the tank interior of the first tank via perforations or openings in the plate in a controlled manner. That is, the liquid coolant may be distributed to the tank interior, via the plate, in an upwards direction opposing a gravity vector. The perforations or openings in the plate may be configured to direct the liquid coolant in the upwards direction toward heat generating features of the electronic components, such as chip sets of the computer servers. In some embodiments, at least one actuator may be employed to modify sizes, geometries, or locations of the openings in the plate in order to modify an amount, direction, or flow rate of the liquid coolant into the tank interior. In this way, direction of the liquid coolant toward the heat generating features of the electronic components is more controllable than conventional embodiments.

Further, an overflow gap may be formed external to the tank interior of the first tank. The overflow gap may be formed between the first tank and a wall positioned external to the first tank. For example, an additional tank or container may be configured to receive the first tank, where a wall of the additional tank and the first tank forms the overflow gap therebetween. As the liquid coolant in the tank interior of the first tank spills over an upper edge of the first tank, the liquid coolant may flow into the overflow gap between the first tank and the second tank. The overflow gap may direct the overflow of the liquid coolant in a downwards direction opposing the upwards direction of the flow of liquid coolant through the tank interior of the first tank. Because the liquid coolant may be heated in the tank interior by the electronic components therein, the flow of the liquid coolant in the upwards direction through the tank interior may be promoted by natural convection. Further, the overflow of the liquid coolant into and through the overflow gap in the downwards direction may be promoted by gravity.

An outlet at a bottom of the overflow gap may direct the liquid coolant toward an external heat exchanger configured to cool the liquid coolant, although the heat exchanger may be excluded and/or turned off in certain relatively cool climates or conditions. A pump may be utilized to move the liquid coolant through various portions of the immersion cooling system, where a speed of the pump is controlled based on a fluid pressure necessary to move the liquid coolant through the various portions of the immersion cooling system. As previously described, natural convection may promote movement of the liquid coolant and, in some embodiments or operating conditions, may be enough to move the liquid coolant without employing the pump, without operating the pump, or by operating the pump at a relatively low speed.

The above-described configuration offers several benefits over conventional systems. For example, the tank interior of the first tank, in which the computer servers are disposed and cooled by the liquid coolant, may be insulated via the overflow gap and the second tank, thereby improving temperature control. Further, the perforated plate (and, in certain embodiments, the adjustable features of the perforated plate) utilized to distribute the liquid coolant to the tank interior may improve temperature control. Further still, by leveraging natural convection as described above, a power consumption of presently disclosed systems may be reduced relative to conventional embodiments. These and other features are described in detail below with reference to the drawings.

FIG. 1 is a schematic illustration of an embodiment of an immersion cooling system 10 configured to cool electronic components 11, such as computer servers. In the illustrated embodiment, the immersion cooling system 10 includes a first tank 12 (e.g., inner tank), a second tank 14 (e.g., outer tank), and a gap 16 (e.g., overflow gap) defined between the first tank 12 and the second tank 14. That is, the gap 16 may be defined between an outer surface 18 of the first tank 12 and an inner surface 20 of the second tank 14. In the illustrated embodiment, the gap 16 surrounds the first tank 12. However, in other embodiments, the gap 16 may border only three sides of the first tank 12, only two sides of the first tank 12, or only one side of the first tank 12. In some embodiments, a lid 19 is disposed over the first tank 12 and the second tank 14. For example, the lid 19 may be coupled to the second tank 14 in an installed configuration. However, the lid 19 may not be sealed against the second tank 14. Accordingly, a space 21 beneath the lid 19 may include a pressure generally equal to atmospheric pressure. In this way, the immersion cooling system 10 may be referred to as an "open bath" configuration, described in more detail below.

The first tank 12 defines a tank interior 22 in which the electronic components 11, such as the computer servers, are disposed. As described in detail with reference to later drawings, a rack system may be disposed in the tank interior 22 for receiving and mounting the electronic components 11 therein. The tank interior 22 of the inner tank 12 also receives a liquid coolant 24, such as a thermally conductive dielectric liquid. The liquid coolant 24 may include, for example, hydrocarbons (e.g., mineral oil, synthetic oil, bio oil) or fluorocarbons. A liquid level 26 of the liquid coolant 24 within the first tank 12 may remain above tops of the electronic components 11, causing the electronic components 11 to be completely submerged in the liquid coolant 24. As previously described, the immersion cooling system 10 in the illustrated embodiment is an "open bath" configuration. Accordingly, the liquid level 26 of the liquid coolant 24 may define a liquid-air interface in which surface tension between the liquid coolant 24 and air promotes heat exchange and desirable fluid flow of the liquid coolant 24 through the system 10.

For example, as described in detail below with reference to later drawings, the liquid coolant 24 may be received through a bottom of the inner tank 12. As the liquid coolant 24 extracts heat from the electronic components 11, the liquid coolant 24 may rise (e.g., relative to a gravity vector 30) in an upwards direction 32 within the tank interior 22 defined by the first tank 12. That is, heated portions of the liquid coolant 24 will tend to rise due to their relatively large densities as cooler portions of the liquid coolant 24 are provided through the bottom of the first tank 12. As the liquid coolant 24 rises in the upwards direction 32 through the tank interior 22 of the first tank 12, the liquid coolant 24 may spill over an upper edge 34 of the first tank 12 and into the gap 16 defined between the outer surface 18 of the first tank 12 and the inner surface 20 of the second tank 14. Accordingly, the gap 16 may be referred to as an overflow gap, as the gap 16 is configured to receive an overflow of the liquid coolant 24 from the tank interior 22. While the liquid level 26 in the illustrated embodiment is denoted just underneath the upper edge 34 of the first tank 12 for purposes of clarity, it should be noted that, in operation, the liquid level 26 may be generally at the upper edge 34 of the first tank 12 or higher, causing the overflow of the liquid coolant 24 into the gap 16.

The gap 16 may direct the overflow of the liquid coolant 24 in a downwards direction 36 opposing the upwards direction 32. That is, the overflow of the liquid coolant 24 may be gravity-fed downwardly in the downwards direction 36. An outlet 38 coupled to a wall 40 of the second tank 14 may receive the overflow of the liquid coolant 24 from the gap 16 and direct the overflow of the liquid coolant 24 toward a heat exchanger 41. The heat exchanger 41 may include a dry tower or a liquid (e.g., water) cooled heat exchanger configured to cool the liquid coolant 24 after the liquid coolant 24 extracts heat from the electronic components 11. In some embodiments, such as those that employ the immersion cooling system 10 in a relatively cool climate, the heat exchanger 41 may be excluded or used only in certain operating conditions described in detail below.

In the illustrated embodiment, the liquid coolant 24 is routed from the heat exchanger 41, through a pump 42 configured to move the liquid coolant 24, and toward an inlet 44 coupled to the wall 40 of the second tank 14. In the illustrated embodiment, the inlet 44 and the outlet 38 are coupled to a common side 40a of the wall 40. However, the wall 40 may include a first side 40a, a second side 40b, a third side 40c, and a fourth side 40d. The inlet 44 may extend from any of the sides 40a, 40b, 40c, 40d of the wall 40, and the outlet 38 may extend from any of the sides 40a, 40b, 40c, 40d of the wall 40. Further, in the illustrated embodiment, each side 40a, 40b, 40c, 40d of the wall 40 borders a portion of the gap 16 between the wall 40 and the first tank 12. In this way, the gap 16 configured to receive the overflow of the liquid coolant 24 completely surrounds the first tank 12. In other embodiments, the gap 16 does not completely surround the first tank 12. For example, in another embodiment, the wall 40 may include only one side, and the gap 16 may be disposed between the first tank 12 and the single side of the wall 40. These and other features will be described in detail with reference to later drawings.

As described above, the pump 42 may be employed during certain operating conditions to move the liquid coolant 24 through the immersion cooling system 10. In some embodiments, the liquid coolant 24 may be biased through the immersion cooling system 10 entirely by natural convection, in which case the pump 42 is excluded or turned off. In other embodiments, a speed of the pump 42 may be controlled based on an amount of fluid pressure needed to move the liquid coolant 24 at a constant pre-defined rate, where the amount of pressure may be dependent on an amount of natural convection that occurs. Thus, a controller 46 may be employed and configured to control the pump 42 and/or the heat exchanger 41. The controller 46 includes a memory 48 storing instructions thereon that, when executed by a processor 50 of the controller 46, cause the processor 50 to perform various functions.

For example, a sensor 52 may be configured to detect an operating parameter of the immersion cooling system 10, such as a temperature of the liquid coolant 24 at any location in the immersion cooling system 10, a pressure of the liquid coolant 24 at any location in the immersion cooling system 10, a flow rate of the liquid coolant 24 at any location in the immersion cooling system 10, the above-described liquid level 26 of the liquid coolant 24 in the tank interior 22 of the first tank 12, a liquid level of the liquid coolant 24 within the gap 16 (described in detail with reference to later drawings), an ambient temperature, or the like. The controller 46 may control a speed of the pump 42 based on feedback from the sensor 52 (e.g., to ensure a constant pre-defined flowrate of the liquid coolant 24 through the immersion cooling system 10). Additionally or alternatively, the controller 46 may control a setting of the heat exchanger 41 based on the sensor feedback received from the sensor 52, such as a speed of a fan of the heat exchanger 41, an amount of cooling water (or other fluid) supplied to the heat exchanger 41, and the like, such that the heat exchanger 41 extracts a pre-defined amount of heat from the liquid coolant 24. In certain operating conditions, a speed of the pump 42 may be set to zero and/or a setting of the heat exchanger 41 may be set to zero. That is, in certain operating conditions, operation of the pump 42 and/or the heat exchanger 41 may not be necessary.

The liquid coolant 24 may be directed through the inlet 44, coupled to the wall 40 of the second tank 14 (e.g., outer tank), and into a chamber 54 defined in the second tank 14 and/or underneath a plate 56 (or panel) extending across the second tank 14. In this way, the plate 56 may separate the chamber 54 from the gap 16 defined between the first tank 12 and the second tank 14. Further, the plate 56 may extend between the chamber 54 and the tank interior 22 of the first tank 12. The plate 56 may be perforated adjacent to a bottom of the first tank 12 (e.g., inner tank), such that the plate 56 includes openings configured to distribute the liquid coolant 24 from the chamber 54 and to the tank interior 22 of the first tank 12. The plate 56 and corresponding openings are hidden from view in FIG. 1 and are illustrated in detail in later drawings. In general, the openings of the plate 56 may be configured to direct the liquid coolant 24 toward particular locations within the tank interior 22 (e.g., toward chip sets or other heat generating aspects of the electronic components 11) and at particular flow rates. In some embodiments, as will be appreciated in view of later drawings and corresponding description, the controller 46 may control at least one actuator configured to adjust a size of the openings or perforations in the plate 56, geometries of the openings or perforations in the plate 56, locations of the openings or perforations in the plate 56, or any combination thereof. In this way, distribution of the liquid coolant 24 through the perforations or openings in the plate 56 may be controlled to target heat generating features, such as chip sets, of the electronic components, to change flow rates of the liquid coolant 24, and the like. It should be noted that the plate 56 may include multiple plate segments, such as a first plate segment configured to separate the chamber 54 from the gap 16, and a second plate segment configured to separate the chamber 54 from the tank interior 22 of the first tank 12 (e.g., where the second plate segment includes the above-described openings or perforations).

The immersion cooling system 10 may also include stabilizing components 60 (such as stabilizing legs, rails, members, or the like) configured to stabilize and level the first tank 12, the second tank 14, or both (e.g., relative to the gravity vector 30). For example, the controller 46 may receive sensor feedback from a level sensor 62 that detects a level of the first tank 12, the second tank 14, or both relative to the gravity vector 30. The controller 46 may control actuation of the stabilizing components 60 based on the sensor feedback, such that the stabilizing components 60 move the first tank 12, the second tank 14, or both to a leveled position. The stabilizing components 60 may be, for example, hydraulic, pneumatic, or electric. Further, while the stabilizing components 60 are illustrated on the second tank 14 in FIG. 1, the stabilizing components 60 may be coupled to the first tank 12 in another embodiment. Further still, other actuatable components for leveling the system 10 may be employed.

Figure 2:
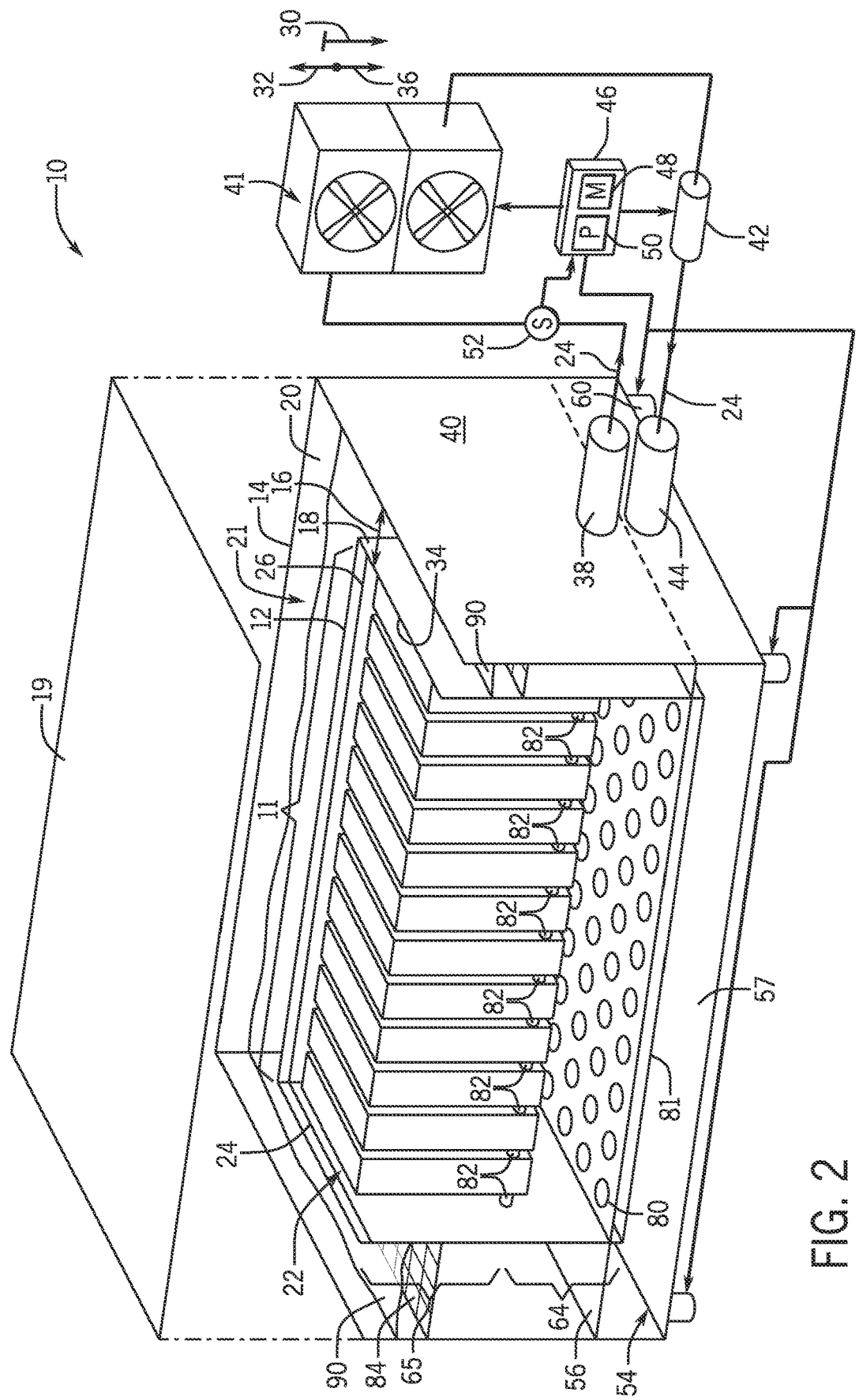
FIG. 2 is a cutaway schematic illustration of a portion of the immersion cooling system of FIG. 1, in accordance with an aspect of the present disclosure.

As described above, the liquid coolant 24 may be directed into the tank interior 22 of the first tank 12 through a bottom of the first tank 12. However, in FIG. 1, distribution of the liquid coolant 24 to the tank interior 22 is blocked from view. Accordingly, FIG. 2 is a cutaway perspective view of an embodiment of a portion of the immersion cooling system 10 of FIG. 1. In the illustrated embodiment, the plate 56 extends across the second tank 14 (e.g., outer tank) such that the plate 56 separates the chamber 54 that receives the liquid coolant 24 from the inlet 44 from the gap 16 that receives the liquid coolant 24 from the tank interior 22 of the first tank 12 (e.g., inner tank). Further, the plate 56 extends between the chamber 54 and the tank interior 22 of the first tank 12. Thus, the chamber 54 is positioned between the plate 56 and a surface 57 of the immersion cooling system 10 (e.g., where the surface 57 may be a part of the additional tank 14 or separate from the additional tank 14). In some embodiments, the plate 56 may extend across a bottom (or lower) side 64 of the first tank 12 and/or define a bottom of the first tank 12, where the bottom side 64 opposes a top (or upper) side 65 of the first tank 12. The plate 56 includes a number of openings 80 (or perforations) configured to distribute the liquid coolant 24 from the chamber 54 to the tank interior 22. The openings 80 define restricted flow paths that cause an acceleration of the liquid coolant 24 from the chamber 54 and into the tank interior 22 of the first tank 12. In some embodiments, the openings 80 are configured to direct the liquid coolant 24 toward heat generating elements of the electronic components 11 (e.g., computer servers).

Further, at least one actuator 81 may be employed to change or adjust aspects of the openings 80 depending on desired flow characteristics of the liquid coolant 24 into the tank interior 22 of the first tank 12. In the illustrated embodiment, the at least one actuator 81 may be a sliding plate that can constrict or expand a size of the openings 80, change the geometries of the openings 80, and/or change the locations of the openings 80. In some embodiments, the at least one actuator 81 may be configured to change locations of the openings 80. For example, in the illustrated embodiment, the system 10 includes racks 82 that are configured to receive the electronic components 11 and mount the electronic components 11 in place. The racks 82 may be movable and/or replaceable based on a configuration (e.g., geometry, size, orientation, etc.) of the electronic components 11 received by the racks 82. The openings 80 may be modified (e.g., via the actuator 81 controlled by the controller 46) based on the configuration of the racks 82 and/or the electronic components 11. As described above, the at least one actuator 81 may be employed to change at least one aspect of the openings 80 such that flow characteristics of the liquid coolant 24 through the openings 80 are modified to improve cooling (e.g., to accurately target heat generating elements of the electronic components 11). More details regarding the actuator(s) 81 will be provided with reference to later drawings.

The illustrated embodiment also includes a filter 84 extending across the gap 16 between the first tank 12 and the second tank 14. Further, a liquid level 90 of the liquid coolant 24 within the gap 16 is illustrated. The filter 84 is configured to remove contaminants from the liquid coolant 24 as the liquid coolant 24 passes through the gap 16. For example, the filter 84 may include pores that are large enough to allow the liquid coolant 24 to pass therethrough and small enough to block contaminants from passing therethrough. The filter 84 may also include a scrubber feature that removes the contaminants from the top of the filter 84 and deposits the contaminants external to the system 10. Other types of filters may be additionally or alternatively employed.

Figure 3:
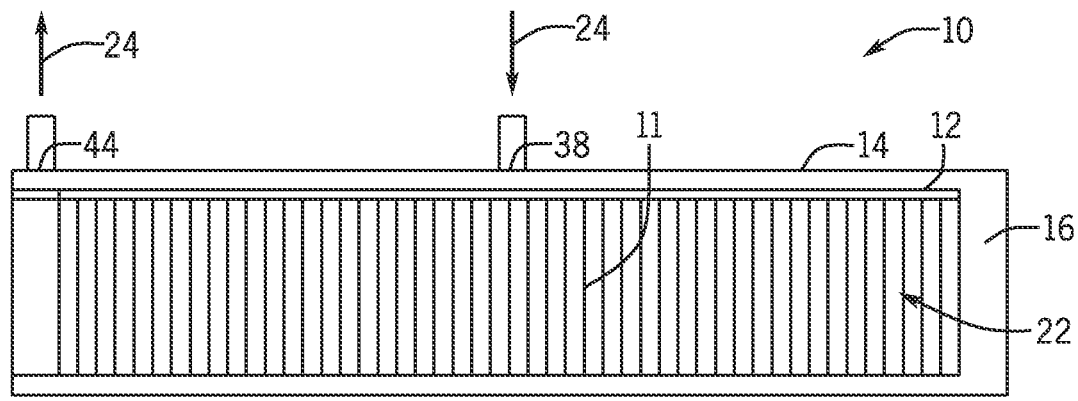
FIG. 3 is a top schematic view of a portion of an immersion cooling system, in accordance with an aspect of the present disclosure.

FIGS. 3-6 include additional illustrations of embodiments of the immersion cooling system 10 (or portions thereof). For example, FIG. 3 is a top view of an embodiment of a portion of the immersion cooling system 10. As shown, the immersion cooling system 10 includes the first tank 12, the second tank 14 (e.g., outer tank, overflow tank, outer container, outer wall[s]), and the gap 16 between the first tank 12 and the second tank 14. The computer servers 11 are disposed within the tank interior 22 of the first tank 12. The inlet 44 (or supply line) for directing the liquid coolant 24 into the system 10 and the outlet 38 for receiving the liquid coolant 24 from the system 10 are provided. It should be noted that the inlet 44 and the outlet 38 are disposed along a different side of the system 10 in FIG. 3 than in FIGS. 1 and 2. As previously noted, the inlet 44 and the outlet 38 may be disposed on any of the four sides 40a, 40b, 40c, 40d of the wall 40 illustrated in FIG. 1.

Figure 4:
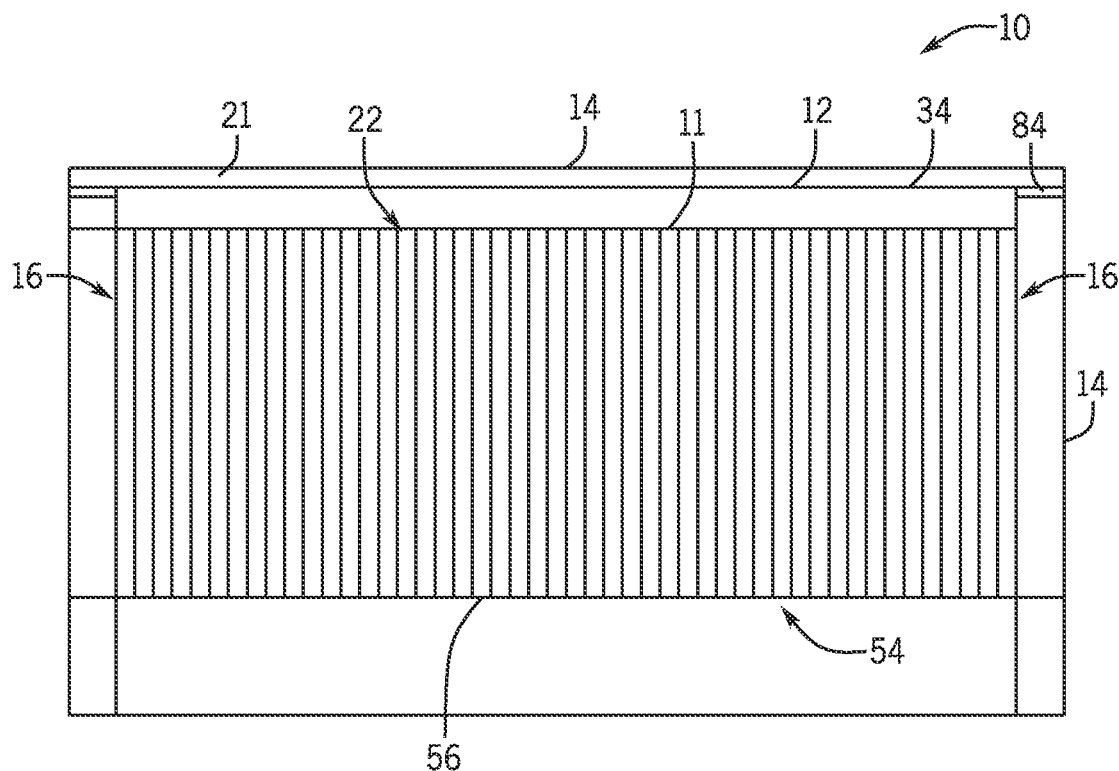
FIG. 4 is a front schematic view of a portion of an immersion cooling system, in accordance with an aspect of the present disclosure.
Figure 5:
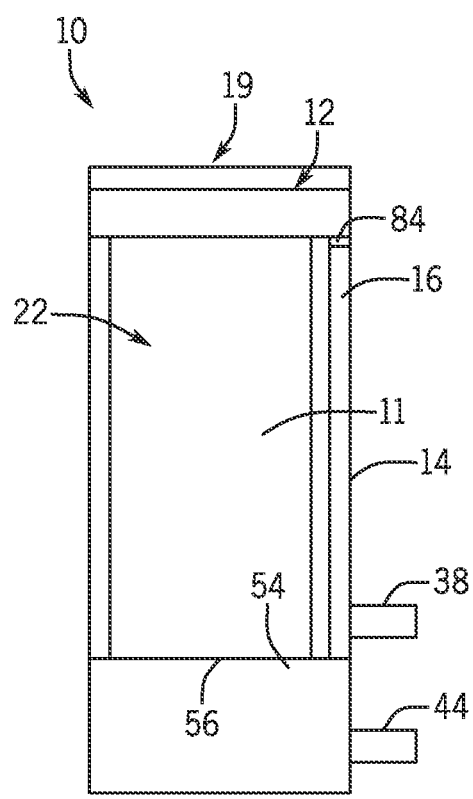
FIG. 5 is a side schematic view of a portion of an immersion cooling system, in accordance with an aspect of the present disclosure.

Further, FIG. 4 is a front view of an embodiment of a portion of the immersion cooling system 10. In the illustrated embodiment, the system 10 includes the first tank 12 (e.g., inner tank), the second tank 14 (e.g., outer tank), and the cover 19 couples to the second tank 14. As previously described, the cover 19 (or lid) may not seal the space 21 underneath the cover 19. Accordingly, the space 21 may include a pressure similar to atmospheric pressure. Also depicted in FIG. 4 is the perforated plate 56, which separates the tank interior 22 of the first tank 12 from the chamber 54, and the gap 16 from the chamber 54. Further, the filter 84 configured to remove contaminants from the liquid coolant 24 is illustrated within the gap 16. Accordingly, as the liquid coolant 24 spills over the upper edge 34 of the first tank 12, the liquid coolant 24 passes through the filter 84 and is cleaned of contaminants. The filter 84, the perforated plate 56, and the chamber 54 are also illustrated in FIG. 5, which includes a side view of an embodiment of a portion of the immersion cooling system 10 of FIG. 1.

Figure 6:
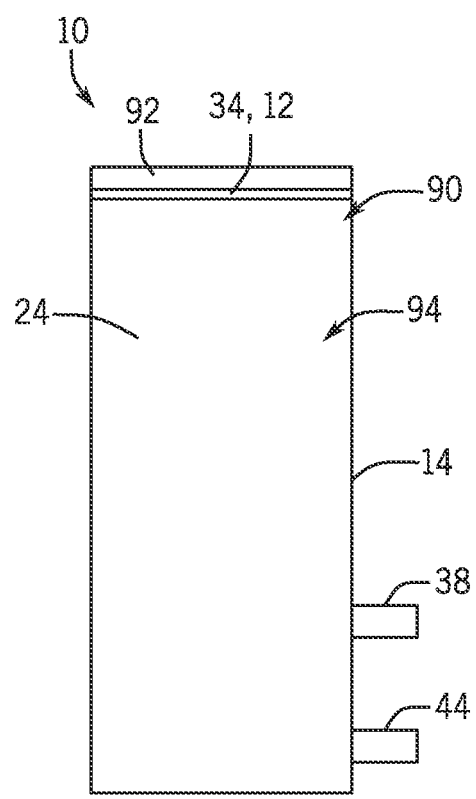
FIG. 6 is another side schematic view of a portion of an immersion cooling system, in accordance with an aspect of the present disclosure.

FIG. 6 is another side view of an embodiment of a portion of the immersion cooling system 10. FIG. 6 illustrates levels of the liquid coolant 24 relative to the gap 16. For example, an actual liquid level 90 of the liquid coolant 24 is denoted in FIG. 6. Further, an upper liquid level threshold 92 (i.e., at or above the upper edge of the first tank 12) is denoted, and a lower liquid level threshold 94 within the gap 16 is denoted. In general, the actual liquid level 90 is maintained between the upper liquid level threshold 92 and the lower liquid level threshold 94. For example, as previously described, the controller 46 in FIGS. 1 and 2 may be configured to control the heat exchanger 41 in FIGS. 1 and 2, the pump 42 in FIGS. 1 and 2, the actuator 81 for changing aspects of the openings 80 in the plate 56 in FIG. 2, or any combination thereof to modify flow rates of the liquid coolant 24 such that the actual liquid level 90 is maintained between the upper liquid level threshold 92 and the lower liquid level threshold 94.

In FIGS. 3-6, the gap 16 may only border three sides of the first tank 12. As previously described, in accordance with the present disclosure, the gap 16 may completely surround the first tank 12, border only three sides of the first tank 12, border only two sides of the first tank 12, or border only one side of the first tank 12. Examples of various configurations of the gap 16 are illustrated in top views illustrating embodiments of the immersion cooling system 10 in FIGS. 7-9. In FIG. 7, the gap 16 borders only one side 100 of the first tank 12. In FIG. 8, the gap 16 borders only two sides 100, 102 of the first tank 12. In FIG. 9, the gap 16 borders only three sides 100, 102, 104 of the first tank 12. An example of the gap 16 surrounding the first tank 12 is provided in FIGS. 1 and 2.

Figure 10:
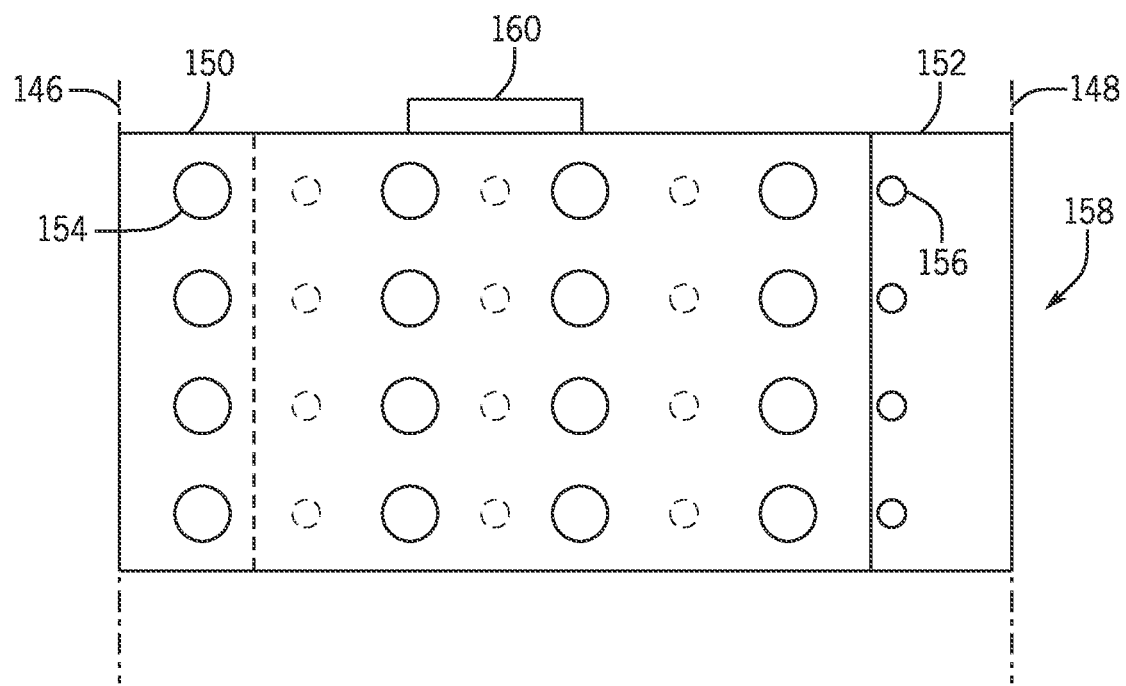
FIG. 10 is a schematic illustration of an adjustable plate configuration for changing openings in a plate configured to distribute a thermally conductive dielectric to a tank interior of a tank of the immersion cooling system, in accordance with an aspect of the present disclosure.
Figure 11:
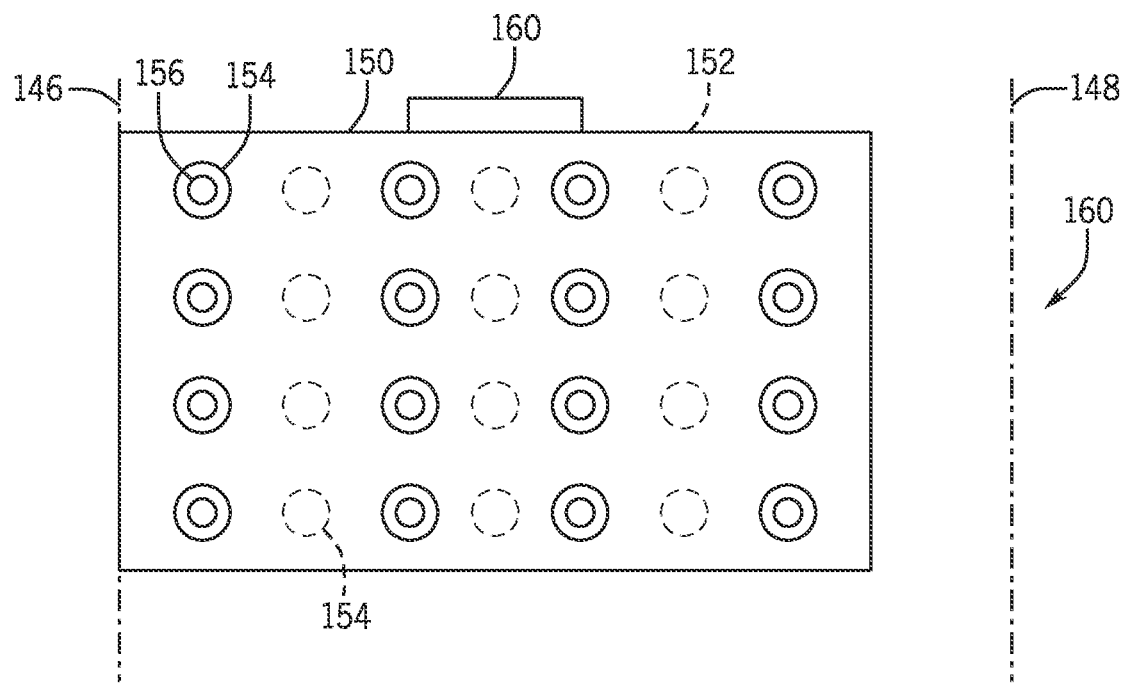
FIG. 11 is a schematic illustration of another adjustable plate configuration for changing openings in a plate configured to distribute a thermally conductive dielectric to a tank interior of a tank of the immersion cooling system, in accordance with an aspect of the present disclosure.

FIGS. 10 and 11 are schematic illustrations of embodiments of adjustable plate configurations for changing sizes, geometries, and/or locations of openings in a plate configured to distribute a thermally conductive dielectric to a tank interior of a tank of the immersion cooling system. For example, a first plate segment 150 may overlap with a second plate segment 152, where the first plate segment 150 and the second plate segment 152 are translatable between a first outermost position 146 and a second outermost position 148. The first plate segment 150 and the second plate segment 152 may be a part of the plate 56 illustrated in at least FIGS. 1 and 2 described above.

The first plate segment 150 includes openings 154 having a first size. The second plate segment 152 also includes the openings 154 having the first size, where the openings 154 of the second plate segment 152 overlap with the openings 154 of the first plate segment 150 and define flow paths through the overlapping openings 154 in FIG. 10 (e.g., the flow paths corresponding to the openings 80 in the plate 56 illustrated in FIG. 2). However, the second plate segment 152 also includes openings 156 having a second size less than the first size of the openings 154. Accordingly, the second plate segment 152 may be translated from the second outermost position 148 to the first outermost position 146, as illustrated in FIG. 11, such that the relatively smaller openings 156 of the second plate segment 152 overlap with the relatively larger openings 154 of the first plate segment 150. Thus, the relatively smaller openings 156 define the flow path (e.g., the openings 80 in the plate 56 illustrated in FIG. 2) through which the thermally conductive dielectric liquid is distributed to a tank interior of the system, as previously described. The relatively larger openings 154 of the second plate segment 152 are closed via the first plate segment 150, as illustrated in FIG. 11. In FIGS. 10 and 11, one or more actuators 160 (e.g., a hydraulically actuated, pneumatically actuated, or electrically actuated track system) may be employed to translate the first plate segment 150, the second plate segment 152, or both.

It should be noted that the first plate segment 150 and the second plate segment 152 could also be shifted from the first outermost position 146 illustrated in FIG. 11 to the second outermost position 148, or anywhere in between the first outermost position 146 and second outermost position 148. Thus, the locations of the distribution channels (e.g., the overlapping openings 154 of the first plate segment 150 and openings of the second plate segment 152) can be moved. Further, in some embodiments, the various openings 154, 156 may include other shapes, such as triangles, squares, rectangles, ovals, ellipses, etc. Further still, it should be noted that FIGS. 10 and 11 are merely examples of adjustable distribution openings that can be incorporated in the plate 56 referenced in at least FIGS. 1 and 2 of the present disclosure. Other mechanisms for adjusting the plate 56 and corresponding distribution openings (or channels) are also possible. Such other possibilities include rotatable features that open, close, move, or otherwise change various distribution openings, translatable features that open, close, move, or otherwise change various distribution openings, and the like.

Figure 12:
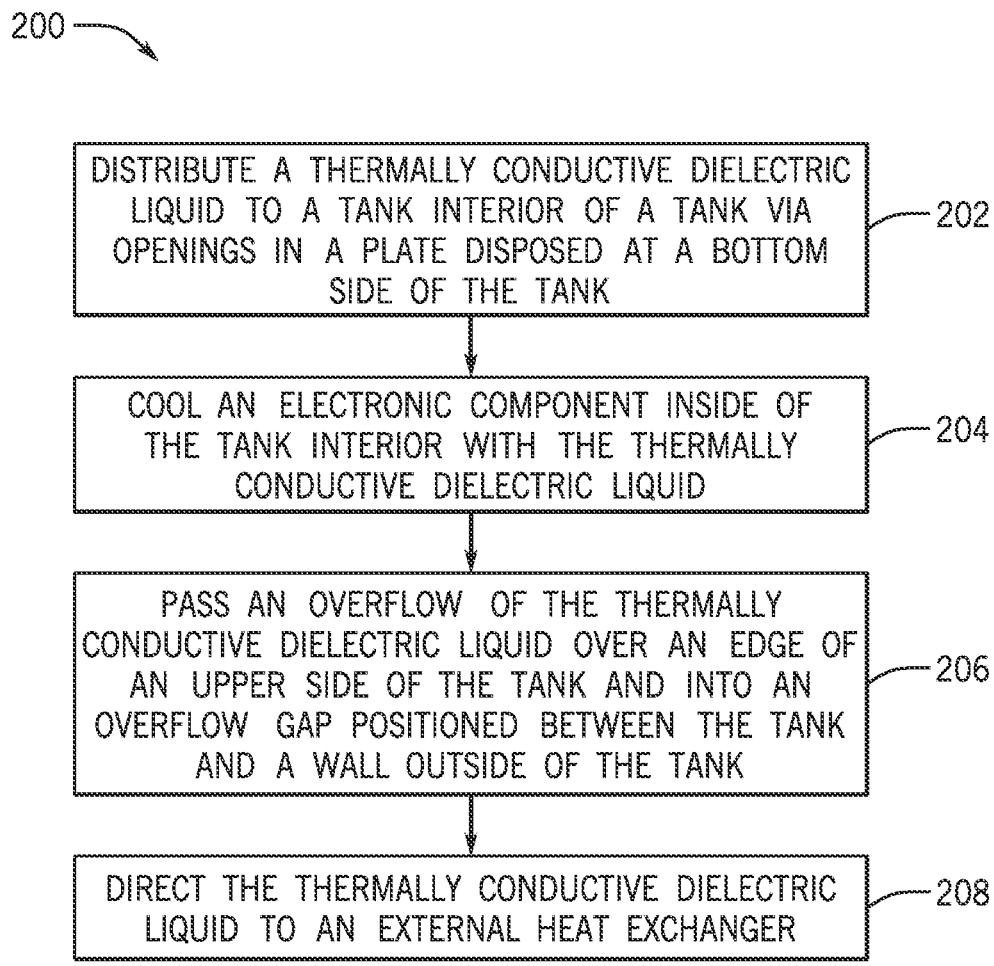
FIG. 12 is a process flow diagram illustrating a method of cooling an electronic component with the immersion cooling system of FIG. 1, in accordance with an aspect of the present disclosure.

FIG. 12 is a process flow diagram illustrating a method 200 of cooling an electronic component with the immersion cooling system of FIG. 1. In the illustrated embodiment, the method 200 includes distributing (block 202) a thermally conductive dielectric liquid (liquid coolant) to a tank interior of a tank via openings in a plate disposed at a bottom side of the tank. In some embodiments, a pump may be employed to bias the thermally conductive dielectric liquid toward the plate. A speed of the pump may be controlled to generate a particular fluid pressure utilized to move the thermally conductive dielectric liquid toward the plate, through the plate, and into the tank interior of the tank. The speed of the pump may be controlled based at least in part on operating conditions of the system. For example, the speed of the pump may be controlled based on a temperature of the liquid coolant, a level of the liquid coolant in the tank interior or in an overflow gap external to the tank, a flow rate of the liquid coolant, or the like (or any combination thereof). Further, in some embodiments, at least one actuator may be controlled to adjust sizes, geometries, and/or locations of the openings in the plate, such that the liquid coolant is directed toward heat generating elements of the electronic components (e.g., computer servers) being cooled by the liquid coolant in the tank interior, and/or such that the flow rate of the liquid coolant is controlled to a target flow rate.

The method 200 also includes cooling (block 204) the electronic component(s) inside of the tank interior with the thermally conductive dielectric liquid (liquid coolant). For example, the liquid coolant extracts heat from the electronic component(s) such that the liquid coolant rises in the tank interior in an upwards direction relative to a gravity vector. As previously described, natural convection may be leveraged to cause a flow of the liquid coolant through the system, including in the upwards direction through the tank interior.

The method 200 also includes passing (block 206) an overflow of the thermally conductive dielectric liquid (liquid coolant) over an edge of an upper side of the tank (e.g., opposing the bottom side of the tank) and into an overflow gap positioned between the tank and a wall disposed external to the tank. The overflow gap may be configured to direct the liquid coolant in a downwards direction relative to the gravity vector, the downwards direction opposing the upwards direction. That is, the liquid coolant may be gravity fed through the overflow gap in the downwards direction and toward an outlet.

The method 200 also includes directing (block 208) the thermally conductive dielectric liquid (liquid coolant) from the outlet and to a heat exchanger external to the tank interior of the tank and the overflow gap between the tank and the wall. The external heat exchanger may be a water-cooled (or liquid-cooled) heat exchanger, an air-cooled heat exchanger (e.g., a dry tower), or some other type of heat exchanger configured to cool the liquid coolant prior to subsequent delivery of the liquid coolant back to the tank interior of the tank. As previously described, a setting of the heat exchanger may be controlled based on an amount of cooling of the liquid coolant required. In some conditions (e.g., relatively cool ambient conditions), the heat exchanger may be excluded or powered off. Other method steps may include leveling the system via stabilizing components (e.g., stabilizing legs, rails, members, or the like) and a controller configured to control actuation of the stabilizing components (e.g., via sensor feedback from a leveling sensor).

Technical benefits associated with the presently disclosed immersion cooling systems and methods include improved temperature control of electronic components (e.g., computer servers) via heat exchange with a thermally conductive dielectric liquid, improved flow control of the thermally conductive dielectric liquid, reduced power consumption of the system, reduced complexity and cost of the system, and the like relative to conventional embodiments.

The present disclosure is not to be limited in scope by the specific embodiments described herein. Indeed, various modifications of the disclosure in addition to those described herein will become apparent to those skilled in the art from the foregoing description. Such modifications are intended to fall within the scope of the appended claims.

While only certain features and embodiments of the disclosure have been illustrated and described, many modifications and changes may occur to those skilled in the art, such as variations in sizes, dimensions, structures, shapes and proportions of the various elements, values of parameters including temperatures and pressures, mounting arrangements, use of materials, colors, orientations, etc., without materially departing from the novel teachings and advantages of the subject matter recited in the claims. The order or sequence of any process or method steps may be varied or re-sequenced according to alternative embodiments. It is, therefore, to be understood that the appended claims are intended to cover all such modifications and changes as fall within the true spirit of the disclosure. Furthermore, in an effort to provide a concise description of the exemplary embodiments, all features of an actual implementation may not have been described, such as those unrelated to the presently contemplated best mode of carrying out the disclosure, or those unrelated to enabling the claimed disclosure. It should be appreciated that in the development of any such actual implementation, as in any engineering or design project, numerous implementation specific decisions may be made. Such a development effort might be complex and time consuming, but would nevertheless be a routine undertaking of design, fabrication, and manufacture for those of ordinary skill having the benefit of this disclosure, without undue experimentation.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ," it is intended that such elements are to be interpreted under 35 U.S.C. 112 (f). However, for any claims containing elements designated in any other manner, it is intended that such elements are not to be interpreted under 35 U.S.C. 112 (f).

All patents, applications, publications, test methods, literature, and other materials cited herein are hereby incorporated by reference.

The invention claimed is:

1. A method of cooling an electronic component via an immersion cooling system, comprising:
   receiving, via a controller and from at least one sensor, sensor data indicative of at least one ambient or operating condition associated with the immersion cooling system;
   controlling, via the controller and based on the sensor data, a fan speed of a fan of a heat exchanger configured to receive a thermally conductive dielectric liquid, cool the thermally conductive dielectric liquid, and output the thermally conductive dielectric liquid;
   distributing the thermally conductive dielectric liquid to a tank interior of a tank;
   cooling the electronic component inside of the tank interior with the thermally conductive dielectric liquid; and
   passing an overflow of the thermally conductive dielectric liquid over an edge of an upper side of the tank opposing a bottom side of the tank and into an overflow gap positioned between the tank and a wall disposed external to the tank.

2. The method of claim 1, comprising cooling the electronic component inside of the tank interior with the thermally conductive dielectric liquid, such that the thermally conductive dielectric liquid is heated by the electronic component and flows through the tank interior in an upwards direction relative to a gravity vector; and
   passing the overflow of the thermally conductive dielectric liquid over the edge of the upper side of the tank opposing the bottom side of the tank and into the overflow gap positioned between the tank and the wall disposed external to the tank, such that the thermally conductive dielectric liquid flows through the overflow gap in a downwards direction relative to the gravity vector, the downwards direction opposing the upwards direction.

3. The method of claim 1, wherein the sensor data indicative of the at least one ambient or operating condition associated with the immersion cooling system comprises data indicative of an ambient temperature.

4. The method of claim 1, wherein the sensor data indicative of the at least one ambient or operating condition associated with the immersion cooling system comprises data indicative of a temperature of the thermally conductive dielectric liquid.

5. The method of claim 1, wherein the sensor data indicative of the at least one ambient or operating condition associated with the immersion cooling system comprises data indicative of a liquid level of the thermally conductive dielectric liquid within the tank interior or the overflow gap.

6. The method of claim 1, wherein the sensor data indicative of the at least one ambient or operating condition associated with the immersion cooling system comprises data indicative of a fluid pressure or a flow rate of the thermally conductive dielectric) liquid.

7. The method of claim 1, comprising:
determining, via the controller and based on additional sensor data indicative of at least one additional ambient or operating condition associated with the immersion cooling system, that circulation of the thermally conductive dielectric liquid through the immersion cooling system can be enabled via natural convection; and
disabling, via the controller, a pump configured to circulate the thermally conductive dielectric liquid through the immersion cooling system in response to determining that the circulation of the thermally conductive dielectric liquid through the immersion cooling system can be enabled via the natural convection.

8. The method of claim 1, comprising controlling, via the controller and based on the sensor data, a speed of a pump configured to circulate the thermally conductive dielectric liquid through the immersion cooling system.

9. The method of claim 1, wherein the sensor data indicative of the at least one ambient or operating condition associated with the immersion cooling system comprises data indicative of a plurality of conditions, the plurality of conditions comprising:
an ambient temperature;
a temperature of the thermally conductive dielectric liquid;
a fluid pressure or flow rate of the thermally conductive dielectric liquid;
a first liquid level of the thermally conductive dielectric liquid within the tank interior; and
a second liquid level of the thermally conductive dielectric liquid within the overflow gap.

10. A method of cooling an electronic component via an immersion cooling system, comprising:
receiving, via a controller and from at least one sensor, sensor data indicative of at least one ambient or operating condition associated with the immersion cooling system;
controlling, via the controller and based on the sensor data, a fan speed of a fan of a heat exchanger configured to receive a thermally conductive dielectric liquid, cool the thermally conductive dielectric liquid, and output the thermally conductive dielectric liquid;
distributing the thermally conductive dielectric liquid through perforations of a perforated plate and into a tank interior of a tank; and
cooling the electronic component inside of the tank interior with the thermally conductive dielectric liquid.

11. The method of claim 10, comprising controlling, via the controller and based on the sensor data, a speed of a pump configured to circulate the the thermally conductive dielectric liquid through the immersion cooling system.

12. The method of claim 10, wherein the sensor data indicative of the at least one ambient or operating condition associated with the immersion cooling system comprises data indicative of a plurality of conditions, the plurality of conditions comprising:
an ambient temperature;
a temperature of the thermally conductive dielectric liquid;
a flow rate or a fluid pressure of the thermally conductive dielectric liquid;
a first liquid level of the thermally conductive dielectric liquid in the tank interior; and
a second liquid level of the thermally conductive dielectric liquid in an overflow gap configured to receive an overflow of the thermally conductive dielectric liquid from the tank interior.

13. The method of claim 10, wherein the sensor data indicative of the at least one ambient or operating condition comprises data indicative of an ambient temperature.

14. A method of cooling an electronic component via an immersion cooling system, comprising:
receiving, via a controller and from at least one sensor, sensor data indicative of at least one ambient or operating condition associated with the immersion cooling system;
changing, via the controller and based on the sensor data, a fan speed of a fan of a heat exchanger configured to receive a thermally conductive dielectric liquid, cool the thermally conductive dielectric liquid, and output the thermally conductive dielectric liquid from a first speed to a second speed;
distributing the thermally conductive dielectric liquid through perforations of a perforated plate and into a tank interior of a tank;
cooling the electronic component inside of the tank interior with the thermally conductive dielectric liquid; and
passing an overflow of the thermally conductive dielectric liquid over an edge of an upper side of the tank and into an overflow gap positioned between the tank and a wall disposed external to the tank.

15. The method of claim 14, comprising controlling, via the controller and based on the sensor data, a speed of a pump configured to circulate the thermally conductive dielectric liquid through the immersion cooling system.

16. The method of claim 14, wherein the sensor data indicative of the at least one ambient or operating condition associated with the immersion cooling system comprises data indicative of a plurality of conditions, the plurality of conditions comprising:
an ambient temperature;
a temperature of the thermally conductive dielectric liquid;
a flow rate or a fluid pressure of the thermally conductive dielectric liquid;
a first liquid level of the thermally conductive dielectric liquid in the tank interior; and
a second liquid level of the thermally conductive dielectric liquid in the overflow gap.

17. The method of claim 14, wherein the sensor data indicative of the at least one ambient or operating condition associated with the immersion cooling system comprises data indicative of an ambient temperature.

18. The method of claim 14, wherein the sensor data indicative of the at least one ambient or operating condition associated with the immersion cooling system comprises data indicative of a temperature of the thermally conductive dielectric liquid.

19. The method of claim 14, wherein the sensor data indicative of the at least one ambient or operating condition associated with the immersion cooling system comprises data indicative of a flow rate or a fluid pressure of the thermally conductive dielectric liquid.

20. The method of claim 14, wherein the sensor data indicative of the at least one ambient or operating condition associated with the immersion cooling system comprises data indicative of a liquid level of the thermally conductive dielectric liquid in the tank interior or the overflow gap.

* * * * *